June 10, 1969 S. KAGAN 3,449,684

AUDIO COMPRESSION AMPLIFIER

Filed Oct. 24, 1966

Sholly Kagan
Inventor
by
Attorney

United States Patent Office 3,449,684
Patented June 10, 1969

3,449,684

AUDIO COMPRESSION AMPLIFIER

Sholly Kagan, 10—12 Indian Rock Road,
East Natick, Mass. 01760

Filed Oct. 24, 1966, Ser. No. 588,968
Int. Cl. H03g 3/30, 3/20
U.S. Cl. 330—29 10 Claims

ABSTRACT OF THE DISCLOSURE

The present invention is related to automatic volume control circuits in radio transmitters, receivers and all forms of audio frequency reproducing equipment. The dynamic range of a signal presented at the input to an amplifier is linearly compressed by shunting said input as a function of the signal strength. A transistor device operating in a passive mode (without gain) is used as the shunt.

*Background of the invention*

Some form of dynamic range limitation is used in most equipment for handling audio frequency signals. In cutting phonograph records, audio compression is used to prevent strong signal peaks from overdriving the recording groove so as to modulate adjacent grooves. Automatic volume control in modulators for radio transmitters made it possible to maintain an efficient level of modulation without over modulating the transmitter. Automatic volume control in a radio receiver helps compensate for signal fade and prevents blasting from relatively strong stations when tuning across the band. Automatic volume control can also help maintain a desired level as a speaker or entertainer moves with respect to a fixed microphone.

Automatic volume control circuits most commonly employ a detector and an R-C integrator for developing a biasing signal reducing the gain of an amplifier in proportion to the input signal strength. Such prior art circuits have disadvantages in their dynamic range capabilities and their linearity. The extent to which the gain of an amplifier can be varied by changing the bias level is quite limited especially if low distortion is important. Much greater dynamic range control is achieved by varying a shunt path for the input signal. Various ways of doing this have been tried. For low distortion the shunt must be bilateral. A bilateral arrangement of two diodes in series and biased by an R-C integrator is one possibility. The shunt connection is made at the common connection of the two diodes. The disadvantage of this arrangement is the usual voltage drop required to cause diode conduction (about .6 volt). This voltage drop produces a non-linearity every time the shunt signal changes polarity. An auxiliary diode AVC system using a single diode shunt is sometimes used in tuned amplifiers where resonant tanks will restore signal symmetry. See the General Electric Transistor Manual, seventh edition (1964), pages 288 and 289.

Thus it is an object of the present invention to provide a novel signal compression circuit.

It is a further object of the invention to provide a circuit for compressing the dynamic range of an amplified signal by shunting the signal before amplification with a transistor operated as a bilateral variable resistance.

It is a further object of the present invention to provide an audio compression amplifier in which the output signal controls a transistor with an unbiased collector-base junction shunting the signal input.

Figure 1:
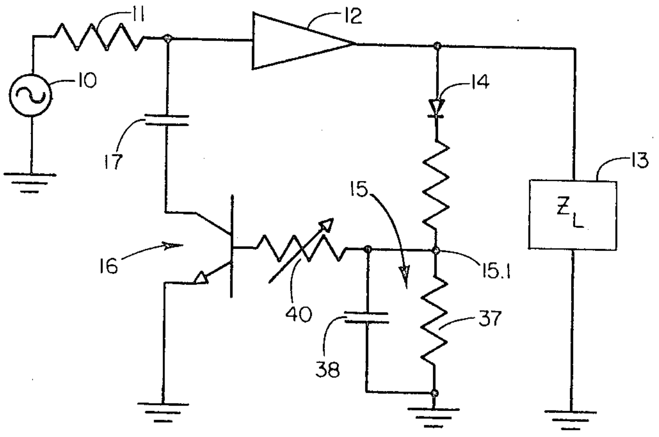
Figure 2:
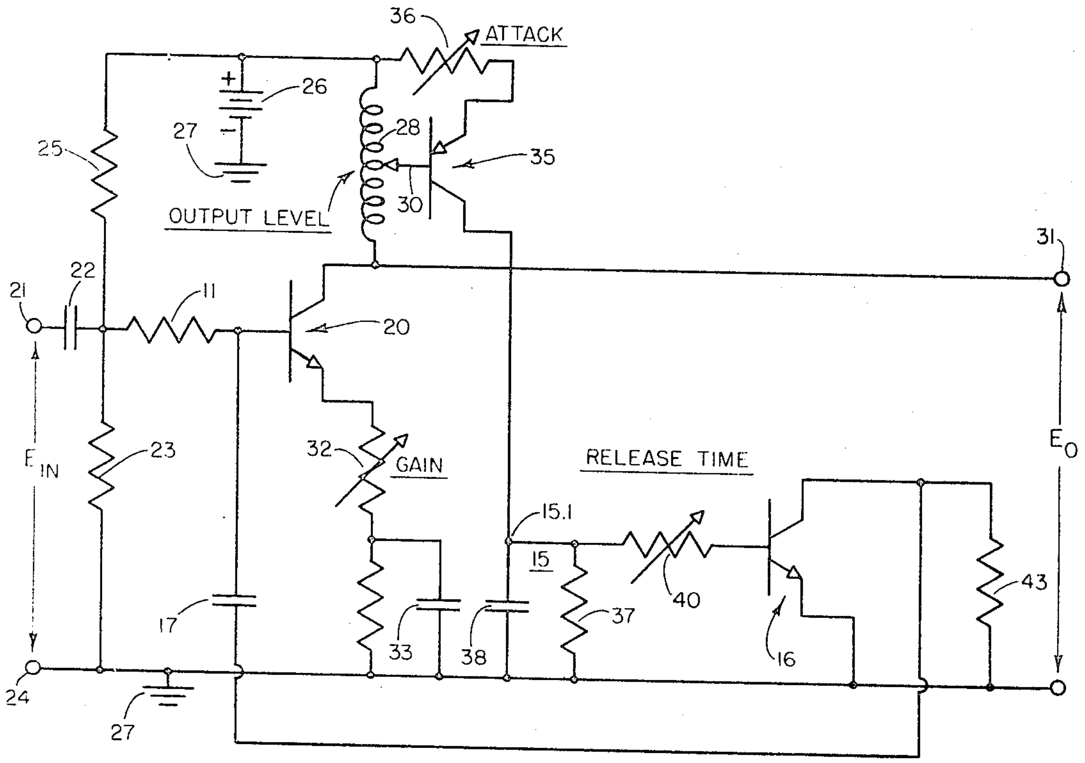

Further objects and features of the invention will become apparent upon reading the following description with reference to the accompanying drawings in which:

FIG. 1 is a generalized schematic of a compression circuit in accordance with the invention; and FIG. 2 is a detailed schematic drawing of a particular compression circuit according to the invention.

*Description of the invention*

The invention is illustrated in simple form in FIG. 1. An input signal source 10 is coupled by a resistor 11 to an amplifier 12. The output of the amplifier 12 is connected to a load impedance 13 ($Z_L$), and to a detector 14 in series with a resistor-capacitor integrating network 15, comprised of a resistor 37 and a capacitor 38. The junction 15.1 of the resistor and capacitor nearer to the detector 14 is connected to the base electrode of a transistor 16 via a resistor 40, which may be variable, as is illustrated. The emitter electrode of transistor 16 is connected to the input signal reference (ground) and the collector electrode is connected through a DC blocking capacitor 17 to the input of the amplifier 12. Amplifier 12 will be understood to contain any desired number of stages. If amplifier 12 is inverting, a further inverting stage can be utilized to provide the correct signal sense to the transistor 16.

In operation, amplifier 12 amplifies the input signal from the source 10. The integrating network 15 provides through the resistor 40 a DC voltage to the base of the transistor 16 which is related to the output signal of the amplifier 12 integrated over a period determined by the R-C time constant of the R-C network 15. Any time this voltage passes the threshold required to produce base-emitter current flow in the transistor 16, the collector-emitter circuit of the transistor 16 becomes an AC shunt at the input of amplifier 12. The blocking capacitor 17 blocks DC in the collector circuit of the transistor 16 so that the state of the transistor will not affect the DC bias level at the input of the amplifier 12. Since no DC voltage is present at the collector electrode of the transistor 16, it operates in a collapsed state as a low impedance AC path equally conductive in both directions. The emitter-collector voltage drop in the transistor 16 is as low as the range of 0 to 0.01 volt DC. No voltage gain occurs and the non-linearities usually associated with transistors and diodes are virtually eliminated. Since we can change the AC impedance between the collector-emitter terminals of the transistor 16 without developing any DC voltages in the collector-emitter path, we can have control of gain of low level signals without the control voltages appearing in the signal path.

Shunting of its input reduces the output of the amplifier 12. The transistor 16 conducts to the extent necessary to maintain the average modulation within predetermined limits. As power output increases, base-emitter current provided from R-C network 15 increases, lowering the emitter-collector AC impedance of the transistor. The input resistor 11 prevents excessive loading of the input signal source 10 by the shunt transistor 16.

An embodiment of the invention is illustrated in greater detail in FIG. 2, in which parts similar to parts in FIG. 1 bear like reference characters. The amplifier 12 of FIG. 1 is represented in FIG. 2 by a transistor 20. Transistor 20 is connected to an input signal terminal 21 through the input resistor 11 and a DC blocking capacitor 22. An operating bias level is set at the base of the amplifier transistor 20 by a voltage divider comprising resistors 23 and 25 connected at one end of each to a common junction with the junction of capacitor 22 and the input resistor 11. The other end of resistor 25 is connected to the positive terminal of a voltage source 26.

The other end of resistor 23 is connected to the negative terminal of the voltage source 26 together with the input reference terminal 24. The negative terminal of source 26 will be hereinafter referred to merely as "reference 27." The collector of the amplifier transistor 20 is connected through a transformer 28 having a variable tap 30 to the positive terminal of the supply 26. The collector of the amplifier transistor 20 is also connected directly to an output terminal 31. The emitter of the amplifier transistor 20 is connected through a resistor 32 to reference 27. A capacitor 33 by-passes a portion of this resistor 32 to reference 27.

The variable tap 30 on the transformer 28 is connected to the base of a detector transistor 35. The emitter of the detector transistor 35 is connected through a variable resistor 36 to the positive terminal of the source 26. The collector of detector transistor 35 is connected through the integrating network 15 to reference 27. The resistor 40 is connected between the junction 15.1 and the base of a third transistor, the main control transistor 16. The emitter of the main control transistor 16 is connected directly to reference 27 (as in FIG. 1) and the collector of transistor 16 is connected to the base of the first transistor (amplifier) 20 through the DC blocking capacitor 17. A resistor 43 is connected between the collector of the control transistor 16 and reference 27. In the circuit illustrated, the first and third transistors 20 and 16 are NPN types while the second transistor 35 is a PNP type. The complementary types can be used with a reversal of source polarity.

Resistors 23 and 25 are a bias source voltage divider for base bias on the amplifier transistor 20. The capacitor 22 couples the audio input to the system over resistor 11 in series with the source (not shown) and the base of the amplifier transistor 20, which for example, may be an NPN planar type of high gain. The portion of resistor 32 adjacent the emitter of the amplifier transistor 20 is not by-passed in order to increase impedance of this transistor amplifier at its base; if this portion is variable it can adjust the system gain. The by-passed portion of resistor 32 controls the DC current through the transistor amplifier. The collector of the transistor 20 is fed into the step-down transformer 28, across which the audio signal develops a voltage. A portion (e.g., one-sixth) of the transformer winding is tapped by tap 30, which can be used to adjust the output level of the system, and the tap is coupled to the detector transistor 35, which detects the signal; that is, when the signal at its base reaches a suitable voltage (e.g., 0.7 volt) negative with respect to the positive potential of the source 26 to which the emitter is connected, the detector transistor 35 is turned on and through transistor action amplifies this particular current in its base to a higher level at which the current is then fed to the capacitor 38 in which this current is integrated. The resistor 37 parallel to the capacitor 38 serves to leak off leakage currents in the detector transistor 35. As soon as the integrated voltage at capacitor 38 exceeds the required voltage (e.g., 0.7 volt) it turns on the control transistor 16, by feeding current into its base through the variable resistor 40. When the base-emitter junction of the control transistor 16 is turned on, transistor action takes place. However, since there is no supply voltage setting a reverse bias on the collector of this transistor, normal DC current does not flow and the transistor goes into a collapsed condition. Under these circumstances the collector-emitter impedance in both directions becomes quite low and this transistor 16 becomes a low AC impedance which shunts the AC signal at the base of the amplifier transistor 20 through the coupling capacitor 17. This capacitor also prevents shorting of the DC bias voltage applied to the amplifier transistor 20. The resistor 43 is optionally connected across the collector-emitter path of the control transistor 16, in order to leak off any DC current that may leak through the coupling capacitor 17. As soon as the main control transistor 16 turns on, its low impedance shunts the input signal to ground, which reduces the voltage in the output of the amplifier transistor 20, and therefore at the base of the detector transistor 35, which controls its gain. Resistor 40 limits the decay time of the integrator capacitor 38 through the base-emitter junction of the main control transistor 16, and therefore, if variable as shown, serves to adjust the release time of the system.

The dynamic range of input signals is of the order of 1,000 to 1. A feature of the system is that the time that it takes to reduce its own gain (i.e., the attack time) can be controlled by the resistor 36 in the emitter of the detector transistor 35, which controls the length of time required to increase the voltage across (i.e., to charge) the integrator capacitor 38. The time required for the system to recover to a higher gain (the release time) is controlled by the discharge time constant of the integrating network together with the resistor 40 and base-emitter path of the control transistor 16. There is no significant change in DC voltage at any time at the collector of the main control transistor 16, therefore no switching transients due to change in gain or feedback to the coupling capacitor 17 and the base of the amplifier transistor 20, to cause signal disturbances or distortion. During conduction the main control transistor 16 operates as a bilateral device passing both half-cycles of an AC signal equally. The amount of signal necessary to turn on the detector transistor 35 for control purposes is so low that no distortion products are formed or visible at the collector of the amplifier transistor 20.

This system may be termed a DC stabilization circuit for audio amplifiers. One of the uses of this system is a modulator for F.M. and A.M. circuits where the amount of signal to the modulator remains constant regardless of the level of the speaking voice as heard by the microphone. Thus, this could be a microphone located in a fixed location in a room and the speaker could be wandering around the room at varying distances from it, and regardless of the distance or the tolerance in the system the voltage applied to the modulator would be constant.

While the invention has been described with relation to specific embodiments it will be understood that these are illustrative only. For example, when a multiple-stage amplifier is used, the detector reference point 30 and the shunt coupling capacitor 17 may be connected to an intermediate stage where the signal level is compatible with the overall design objectives.

I claim:

1. In a signal compression amplifier circuit comprising at least one amplifier stage having signal input, output and reference terminals, respectively, means providing a control signal path of such low resistance as to generate substantially no voltage drop that will appear effectively in the signal path, comprising a detector of the amplified signal, an integrator, driven by said detector, and AC shunt means responsive to said integrator for shunting a portion of the input signal to said signal reference terminal as a function of signal amplitude; the combination in said shunt means comprising a control transistor having base, collector and emitter electrodes with its collector-emitter path AC connected substantially without voltage bias between said signal reference terminal and said signal input, means comprising a capacitor connected between said collector electrode and said signal input terminal to isolate said collector-emitter path from direct current potentials in said circuit, and means connecting the base electrode of said transistor to be driven by said integrator, said emitter being connected directly through a substantially nonresistive path to said signal reference terminal, whereby the control signal path from base electrode to emitter electrode to said signal reference terminal has substantially no added resistance and thereby does not introduce any nonlinearity into the signal path when current passes through the control signal path.

2. In a signal compression amplifier according to claim 1 the combination in which said input terminal is the base electrode of a second transistor connected as a common emitter amplifier with its emitter electrode resistively connected to said reference terminal.

3. Signal compression amplifier according to claim 2 second transistor emitter electrode and said reference terminal for controlling the gain of said amplifier.

4. In a signal compression amplifier according to claim 1, the combination in which said output terminal is the collector electrode of a second transistor connected as a common emitter amplifier with a tapped impedance connecting the collector electrode of said second transistor to a voltage supply terminal and in which said detector is a third transistor of complementary type with respect to said second transistor with its base electrode connected to a tap on said tapped impedance, its emitter electrode connected to said supply terminal and its collector electrode connected to said integrator in the form of an R–C integrating network.

5. In a signal compression amplifier according to claim 4 the combination in which the base electrode of said control transistor is connected to the collector electrode of said third transistor and the emitter electrode of said control transistor is directly connected to a point of fixed potential with respect to said supply terminal whereby the emitter-collector conductivity of said shunt transistor varies with the charge in said integrating network.

6. In a signal compression amplifier according to claim 4 the combination in which said tapped impedance is a transformer, and the location of said tap thereon controls the output level of said circuit.

7. In a signal compression amplifier according to claim 1, the combination in which said control transistor is connected in common emitter configuration with its emitter connected to said signal reference terminal, said integrator is connected between said signal reference terminal and the base electrode of said control transistor and a voltage supply is provided with polarity in the forward bias direction of the control transistor base electrode whereby the conductivity of said control transistor varies directly with signal magnitude.

8. In a signal compression amplifier according to claim 4, a variable resistor connected between said third transistor emitter electrode and said supply terminal, for controlling the attack time of said AC shunting means.

9. In a signal compression amplifier according to claim 1, a variable resistor connected between said integrator and said base electrode for controlling the release time of said AC shunting means.

10. In a signal amplifier according to claim 9, means to supply a potential to said detector and means to vary the magnitude of said potential for controlling the attack time of said AC shunting means.

References Cited

UNITED STATES PATENTS

| | | | |
|---|---|---|---|
| 3,109,993 | 11/1963 | Blair | 330—145 X |
| 3,117,287 | 1/1964 | Damico | 330—29 X |
| 3,215,940 | 1/1965 | Fisher | 330—29 X |

OTHER REFERENCES

English, "Small-Signal Amplifier," IBM Technical Disclosure, vol. 8, No. 4, September 1965, pp. 688–689.

IRE Convention Record, pt. 7, Mar. 22–25, 1954, p. 13.

JOHN KOMINSKI, *Primary Examiner.*

J. B. MULLINS, *Assistant Examiner.*

U.S. Cl. X.R.

330—138, 141, 145

UNITED STATES PATENT OFFICE
CERTIFICATE OF CORRECTION

Patent No. 3,449,684 June 10, 1969

Sholly Kagan

It is certified that error appears in the above identified patent and that said Letters Patent are hereby corrected as shown below:

Column 4, after line 75, insert -- in which a variable resistor is connecte between said --.

Signed and sealed this 14th day of April 1970.

(SEAL)
Attest:

Edward M. Fletcher, Jr.
Attesting Officer

WILLIAM E. SCHUYLER, JR.
Commissioner of Patents